US010632783B1

(12) United States Patent
Chacon et al.

(10) Patent No.: US 10,632,783 B1
(45) Date of Patent: Apr. 28, 2020

(54) METHOD FOR ADHERING EMBELLISHMENTS TO A GLASS SUBSTRATE

(71) Applicants: Ysidro C. Chacon, Fowler, CA (US); Nicole M. Chacon, Fowler, CA (US)

(72) Inventors: Ysidro C. Chacon, Fowler, CA (US); Nicole M. Chacon, Fowler, CA (US)

(*) Notice: Subject to any disclaimer, the term of this patent is extended or adjusted under 35 U.S.C. 154(b) by 240 days.

(21) Appl. No.: 15/799,970

(22) Filed: Oct. 31, 2017

Related U.S. Application Data

(60) Provisional application No. 62/489,459, filed on Apr. 25, 2017.

(51) Int. Cl.
B44C 1/26 (2006.01)
C03C 19/00 (2006.01)
G03F 7/16 (2006.01)
G03F 7/32 (2006.01)
B44C 1/22 (2006.01)
G03F 7/20 (2006.01)
A47G 19/22 (2006.01)

(52) U.S. Cl.
CPC ............... B44C 1/26 (2013.01); B44C 1/221 (2013.01); C03C 19/00 (2013.01); G03F 7/16 (2013.01); G03F 7/2002 (2013.01); G03F 7/32 (2013.01); A47G 19/2205 (2013.01)

(58) Field of Classification Search
CPC ...... A47G 19/2205; B44C 1/26; B44C 1/221; C03C 19/00
See application file for complete search history.

(56) References Cited

U.S. PATENT DOCUMENTS

| 4,801,490 A * | 1/1989 | Schuette | ........ B24C 1/04 427/258 |
| 8,661,702 B2 | 3/2014 | Ihm | |
| 2003/0160026 A1 | 8/2003 | Klein et al. | |
| 2016/0221380 A1 * | 8/2016 | Tarter | ........ B44C 1/22 |

* cited by examiner

Primary Examiner — Mark A Osele
Assistant Examiner — Christopher C Caillouet
(74) Attorney, Agent, or Firm — William Nelson; Jared Christensen; Mark D. Miller

(57) ABSTRACT

A method for adhering embellishments to a glass substrate. The method provides a depression in the glass matching the shape of the embellishment, allowing for a lower profile and protecting the adhesive from water and solvents, thus reducing the chance of the embellishment falling off of the glass.

20 Claims, 4 Drawing Sheets

METHOD FOR ADHERING EMBELLISHMENTS TO A GLASS SUBSTRATE

This application claims the benefit of U.S. Provisional Patent Application No. 62/489,459, filed on Apr. 25, 2017, which is incorporated herein by this reference in its entirety.

FIELD OF THE INVENTION

The present invention relates to an improved method for adhering embellishments to a glass substrate. Specifically, the present invention relates to an improved method for gluing rhinestones to a wineglass.

DISCUSSION OF THE BACKGROUND

Many consumers love personalized gifts and in today's market everyone wants something a little more unique than the last. Addition of rhinestone embellishments to glassware has become one way of personalizing a gift for a friend or loved one. However, existing methods for adhering rhinestones to glasses are undesirable as the rhinestones are mounted with glue at the surface of the glass. This leaves the glue susceptible to dissolving in hot water or other cleaning solvents, and the rhinestones quickly fall off while cleaning the glasses.

It is common to utilize a dishwasher to clean glassware, or to wash glassware by hand. Putting a glass embellished with rhinestones via existing methods into a dishwasher subjects the glue to jets of extremely hot water. Further, washing such a glass by hand subjects the glue to warm water and harsh soap, and puts lateral mechanical forces on the rhinestone at the same time. Existing methods of adhering embellishments to glasses are thus undesirable, as both of the common processes for cleaning glassware often lead to the loss of rhinestones on such glasses.

Therefore, an improved method for adhering rhinestones and other embellishments to glassware is desired which protects the glue from exposure to hot water and solvents, and lowers the profile of the rhinestones to decrease lateral mechanical forces acting on them during hand washing.

SUMMARY OF THE INVENTION

The present invention provides an improved method for adhering embellishments to a glass substrate, which may be various kinds of glass such as borosilicate glass, fused silica glass, 96% silica glass, soda-lime glass, lead glass, aluminosilicate glass, and other forms of glass. The improved method offers significant advancements to the longevity of the embellishments. The method may include: creating a design corresponding to the shape of embellishment (e.g., the shape of a rhinestone); creating an abrasion resistant template (e.g., a stencil) having the design therein; applying the template to a glass substrate (e.g., a wine glass); using the template to translate the design into the glass substrate (e.g., by spraying abrasive blasting media into glass by sandblasting) to create a depression in the glass substrate that is complementary to the embellishment; removing the template; applying an adhesive to the depression; and positioning an embellishment in the depression. In some embodiments, the method may include the additional step of curing the adhesive.

Embodiments of the design may comprise a digital image. In some embodiments, the digital image may be created via a computer program. In some embodiments, the digital image may be printed onto an otherwise transparent medium (e.g., transparent film), used as a photomask. In other embodiments, the design may be drawn directly onto the transparent medium. In some embodiments, the design may comprise a plurality of embellishment shapes representing the shapes of a plurality of embellishments to be adhered to the glass substrate. In some embodiments, the design may comprise at least one embellishment shape and at least one artistic shape, the embellishment shape representing the shape of an embellishment to be adhered to the glass substrate, and the artistic shape intended to be translated into the glass substrate as an artistic etching without an adhered embellishment.

The abrasion resistant template may comprise an ultraviolet ("UV") sensitive film. In some embodiments, the process of applying the design to the UV sensitive film may comprise covering the UV sensitive film with a photomask for transferring a pre-determined design (e.g., a star shape, a diamond shape, etc.) to the glassware. The photomask may have a transparent portion in the shape of the pre-determined design that allows the UV light to penetrate the photomask. The UV sensitive film may be covered with the photomask and UV light may be applied to a portion of the UV sensitive film through the transparent portion of the photomask to transfer the pre-determined design to the UV sensitive film. The portion(s) of the UV sensitive film that is exposed to the UV light through the photomask is chemically altered (e.g., becoming brittle and removable). The UV sensitive film may subsequently be treated (e.g., blasted with an abrasive medium, such as silicon carbide) to remove the chemically altered portion of the UV sensitive film, leaving a template with openings in the shape of the design. In other embodiments, the design may be applied to the template via cutting the template with at least one of a blade, a laser, and compressed air. In yet other embodiments, the design may be applied to the template by pressing the embellishment through the template.

In some embodiments, the step of applying the template to the glass substrate may comprise use of a template adhesive. In some embodiments, the template may comprise the template adhesive on a bottom surface, the template adhesive being capable of removably adhering the template to the glass substrate. In some embodiments, the template adhesive may be protected by a protective film which may be peeled off of the bottom surface after the template is exposed to UV light and developed. In other embodiments, the template adhesive may be applied to the glass substrate prior to application of the template. In some embodiments, the glass substrate may comprise a wine glass. In other embodiments, the glass substrate may comprise at least one of a beer glass, a pint glass, a coffee cup, a liquor glass, a vase, a plate, as sheet of glass, and the like. In other embodiments, the glass substrate may comprise a mirror or a window.

In some embodiments, the step of spraying abrasive blasting media (e.g., silicon carbide) into the design in the template to create a depression in the glass substrate may comprise the use of a sandblasting device. In some embodiments, the sandblasting device may comprise a commercially available sandblasting device. In some embodiments, the sandblasting device may be directed at the design in the template until a depression is created in the glass substrate. The depression may comprise a shape complementary to a shape of the embellishment, and a depth suitable to adhere the embellishment in the glass substrate in a recessed manner. In such embodiments, a profile of the embellishment in relation to the surface of the glass substrate may be reduced, in turn reducing the lateral force applied to the embellishment while being hand-washed or handled. Further, in such embodiments, the adhesive used to mount the embellishment may be protected from exposure to jets of hot water and solvents while being washed in a dishwasher.

In embodiments wherein the design comprises both an embellishment shape and an artistic shape, sand may be sprayed into the embellishment shape for a longer period of time than the artistic shape, thus creating a deeper depression under the embellishment shape than under the artistic shape. In such embodiments, the embellishment may be mounted in the glass substrate with a reduced profile, while the depression under the artistic shape creates a shallow etching in the glass substrate.

In some embodiments, the step of removing the template may comprise peeling the template off of the glass substrate by hand. In other embodiments, removal of the template may comprise the use of a glass cleaner or other solvent to remove residue from the template adhesive. In some embodiments, the glass cleaner may be a commercially available glass cleaner (e.g., Windex).

In some embodiments, one or more embellishments (e.g., rhinestones, gems, beads, metallic patterns, etc.) may be seated and adhered to the depressions formed in the glass substrate. The embellishments may be adhered to the glass in the depressions using a low viscosity, solvent and temperature resistant, UV curable adhesive that results in little to know visible layer of adhesive between the glass substrate and the embellishments, resulting in an improved aesthetic appearance over embellished glassware made with conventional techniques. The viscosity of the UV-curable adhesive may be in a range of about 10 cps to about 60 cps (e.g., or any value or range of values therein). Additionally, the combination of the nesting or seating of the embellishments in the depressions and the solvent and temperature resistance of the UV curable adhesive allow the embellished glassware or other glass substrate to be run through a washing cycle of a commercial or domestic dishwashing unit or other high pressure and/or high temperature process without risk of the embellishments detaching from the glass substrate. This is a significant improvement over embellished glassware made with conventional techniques—such glassware cannot be run through a dishwashing cycle without risk of detachment of the embellishment. In some embodiments, the UV curable adhesive may be an acrylate-based UV-curable resin having excellent transparency, adhesion reliability, durability, and temperature and pressure resistance. Examples of such resins include composition formed primarily of a polyurethane acrylate-based main-chain polymer, a poly-isoprene acrylate-based main-chain polymer, a polybutadiene acrylate-based main-chain polymer, and or monomeric (meth)acrylate. In this case, linear hydrocarbon-based solvents such as hexane and heptane, aromatic hydrocarbon-based solvents such as toluene and xylene may be used as a solvent for the composition.

The UV-curable adhesive may be applied to the depression using an eyedropper-style dispenser, a brush, a stick, and/or other appropriate tools. An embellishment having a shape complementary to the shape of the depression may be placed into the depression after the adhesive is applied. In some embodiments, the embellishment may be positioned by hand or with a hand tool (e.g., jeweler's forceps). In other embodiments, the embellishment may be mechanically positioned. In some embodiments, the embellishment may comprise at least one of a rhinestone, a bead, a jewel, a piece of metal, and the like. In some embodiments, the piece of metal may comprise the shape of a letter or a symbol.

After the embellishment is placed in the depression, UV like may be shined on the adhesive through the glass substrate for a period of time (e.g., 2 to 5 minutes) to cure the adhesive. After the UV exposure period, the UV-curable adhesive may be fully cured and the embellishment set in the depression.

Several embodiments are discussed below, but the example embodiments shall not be interpreted as an exhaustive list. One with ordinary skill in the art will recognize that the scope of the present invention includes further variations and equivalents to the specific examples described herein.

In one implementation, the present invention relates to a method for adhering an embellishment to a glass substrate, comprising the steps of: creating a design corresponding to the shape of an embellishment; creating a template having the design therein; applying the template to the glass substrate; transferring the design in from the template to the glass substrate to create an etching of the design in the glass substrate; removing the template; applying an adhesive to the depression; and positioning and securing an embellishment in the depression by applying a low-viscosity glue and curing the glue with UV light. The UV-curable glue offers an improvement over the prior art because the UV-curable glue, once cured by UV radiation is translucent and substantially imperceptible to the human eye.

In some implementations, the design comprises a plurality of embellishment shapes. In some implementations, the design further comprises an artistic shape (into which no embellishment is deposited). In some implementations, the glass substrate comprises at least one of a wine glass, a beer glass, a pint glass, a liquor glass, a coffee cup, a vase, a plate, as sheet of glass, and the like. In some implementations, the glass substrate comprises at least one of a mirror and a window. In some implementations, the template comprises an abrasion resistant material. In some implementations, the template comprises a UV sensitive film. In some implementations, the design is applied to the UV sensitive film via exposure to UV light through a transparent medium. In some implementations, the design is applied to the template via cutting the template with at least one of a blade, a laser, and compressed air. In some implementations, the template comprises a template adhesive. In some implementations, applying the template to the glass substrate comprises application of a template adhesive to the glass substrate prior to application of the template. In some implementations, the abrasive blasting media is sprayed into the design via a sandblasting device. In some implementations, abrasive blasting media (e.g., silicon carbide, sand, aluminum oxide, etc.) is sprayed into the embellishment shape for a longer period of time than sand is sprayed into the artistic shape. In some implementations, the depression comprises a shape complementary to the shape of an embellishment. In some implementations, the method further comprises the step of curing the adhesive. In some implementations, the adhesive comprises a UV sensitive glass glue, and curing the adhesive comprises exposure to UV light for a period of time. In some implementations, the adhesive is applied via an eye-dropper style dispenser. In some implementations, the adhesive is applied via at least one of a stick and a brush. In some implementations, the embellishment comprises at least one of a rhinestone, a bead, a jewel, a piece of metal, and the like. In some implementations, the shape of the piece of metal comprises at least one of a letter and a symbol.

It is an objective of the present invention to provide a method for adhering embellishments to a glass substrate which reduces the chance of the embellishments falling off of the glass substrate.

It is a further objective of the present invention to provide a method for adhering embellishments to a glass substrate which protects the adherent from hot water and solvents while the glass substrate is washed.

It is a further objective of the present invention to provide a method for adhering embellishments to a glass substrate which lowers the cross-sectional profile of the embellishments to reduce lateral forces on the embellishments.

Additional aspects and objects of the invention will be apparent from the detailed descriptions and the claims herein.

DETAILED DESCRIPTION OF THE EXEMPLARY EMBODIMENTS

Figure 1:
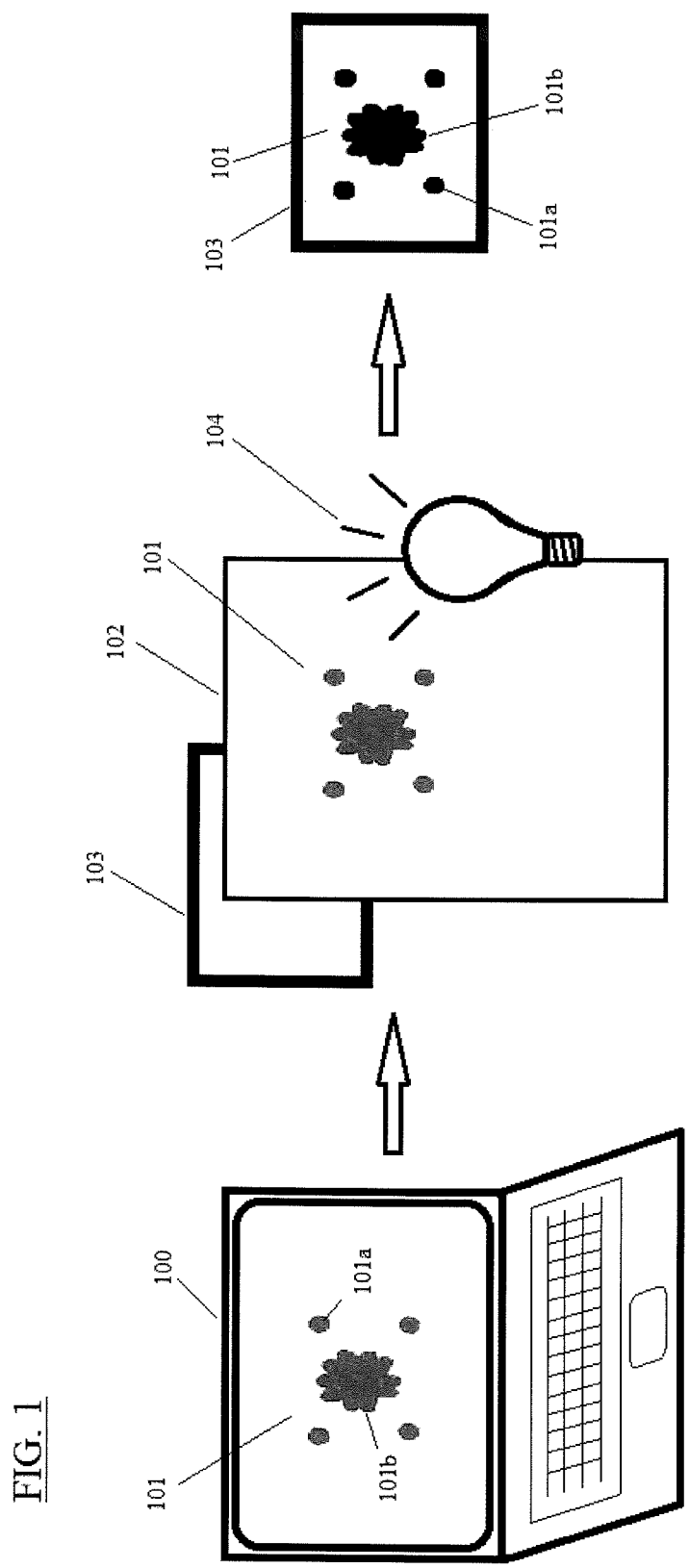
FIG. 1 shows a perspective view of steps of a method for adhering embellishments to a glass substrate.

Reference will now be made in detail to certain embodiments of the invention, examples of which are illustrated in the accompanying drawings. While the invention will be described in reference to these embodiments, it will be understood that they are not intended to limit the invention. Conversely, the invention is intended to cover alternatives, modifications, and equivalents that are included within the scope of the invention as defined by the claims. In the following disclosure, specific details are given as a way to provide a thorough understanding of the invention. However, it will be apparent to one skilled in the art that the present invention may be practiced without these specific details.

Referring to the drawings, wherein like reference characters designate like or corresponding parts throughout the several views, and referring particularly to FIGS. 1-4, it is seen that the present invention includes various embodiments of a method for adhering embellishments to a glass substrate which reduces the profile of the embellishments and protects the adherent from hot water and solvents.

Without limiting the invention, FIG. 1 illustrates the steps of creating a design 101 representing the shape of at least one embellishment 110 to be applied to a glass substrate 105 (see FIG. 3), and applying the pre-determined design 101 to an abrasion resistant template 103 such that the design represents an opening in the template 103, according to an embodiment of the present invention. Embodiments of the pre-determined design 101 may comprise a digital image that is transferred to a transparent medium to generate a photomask that allows UV light to pass through a portion of the transparent medium in the shape of the pre-determined design. In some embodiments, the pre-determined design 101 may be created on a computer 100. In some embodiments, the predetermined design 101 may be printed onto the otherwise transparent medium (e.g., transparent film) to create a photomask 102. In some embodiments, the pre-determined design 101 may comprise a plurality of shapes 101a representing the shapes of a plurality of embellishments 110 to be adhered to a glass substrate 105. In some embodiments, the pre-determined design 101 may comprise at least one embellishment shape 101a and at least one artistic shape 101b (into which no embellishment is deposited), the embellishment shape 101a representing the shape of an embellishment 110 to be adhered to the glass substrate 105, and the artistic shape 101b representing an artistic etching 108 in the glass substrate 105 without an adhered embellishment (see FIG. 3).

Embodiments template 103 may comprise abrasion resistant material. In some embodiments, the template 103 may comprise a UV sensitive film. In some embodiments, the process of applying the pre-determined design 101 to the template 103 may comprise covering the template 103 with the photomask 102, wherein the transparent portion of the photomask 102 is a pre-determined design 101, exposing the template 103 to UV light 104, and then developing the template 103 such that the areas exposed to UV light (i.e., the design) are chemically altered such that the exposed areas become brittle and weak. In some embodiments, the template 103 may comprise a commercially available UV sensitive film.

Figure 2:
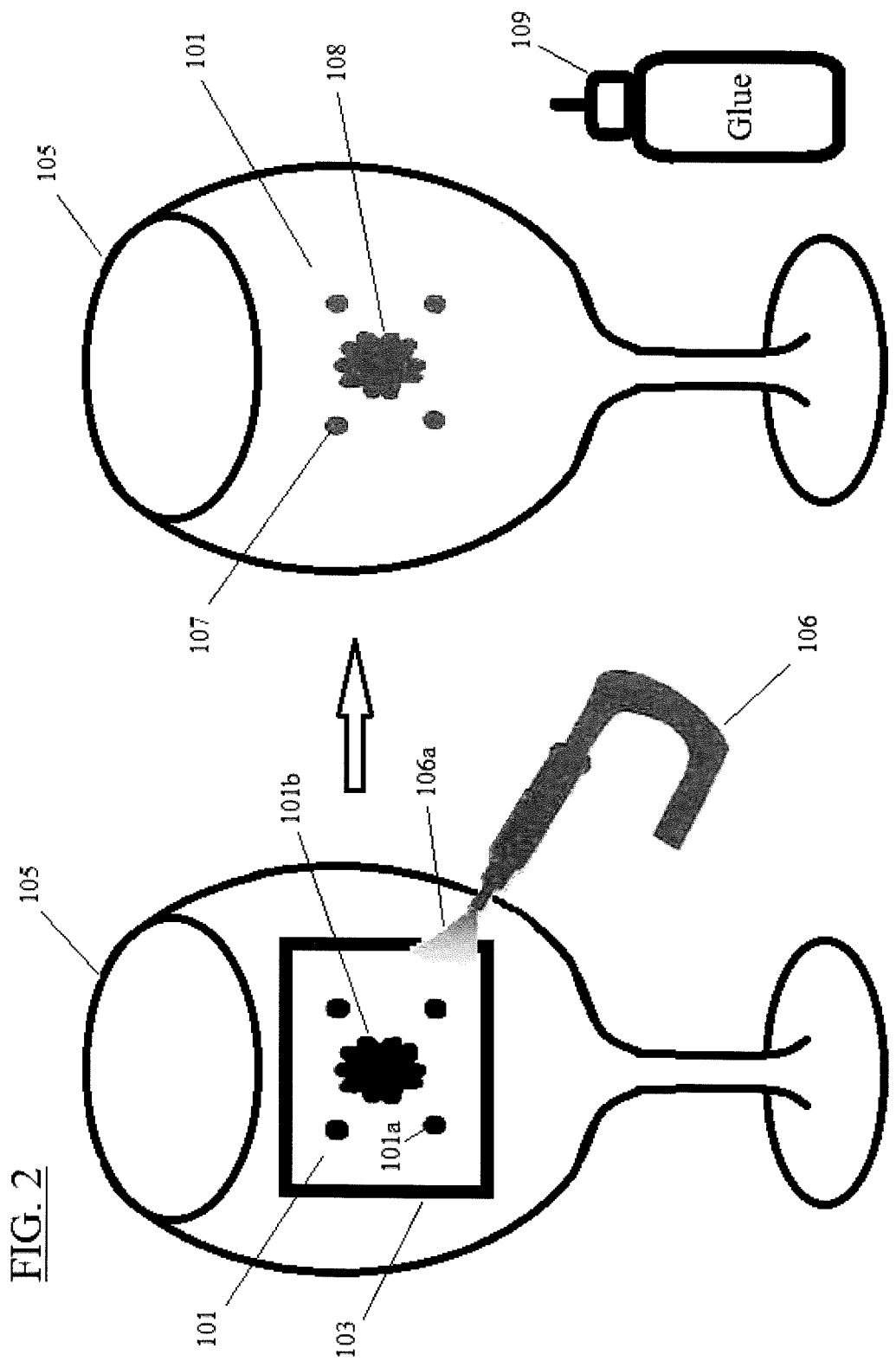
FIG. 2 shows a perspective view of steps of a method for adhering embellishments to a glass substrate.
Figure 3:
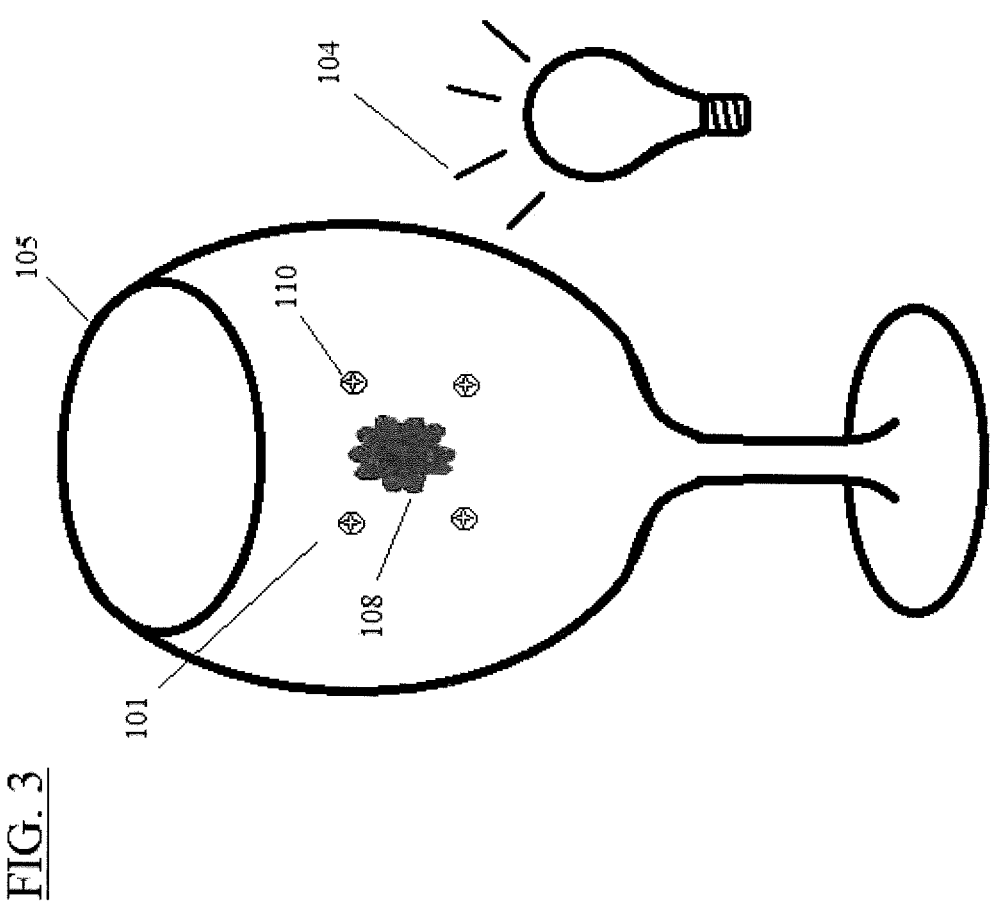
FIG. 3 shows a perspective view of steps of a method for adhering embellishments to a glass substrate.
Figure 4:
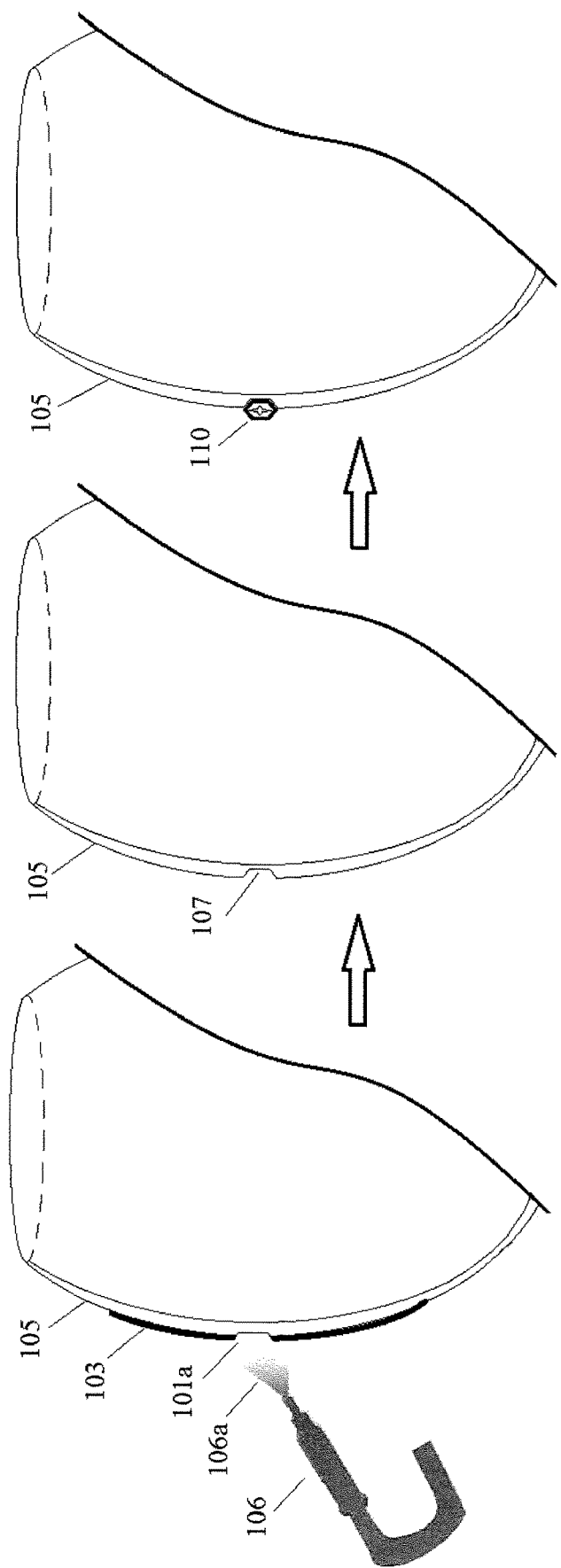
FIG. 4 shows a side cross-section view of steps of a method for adhering embellishments to a glass substrate.

Without limiting the invention, FIGS. 2-4 illustrate the steps of applying the template 103 to the glass substrate 105, spraying abrasive blasting media 106a onto the template 103 to remove the brittle UV-exposed portion to make a stencil, spraying the blasting medium through the stencil onto the glass substrate through the template 103 to create a depression 107 in the glass substrate 105, removing the template 103, applying an adhesive 109 to the depression 107, and positioning an embellishment 110 in the depression 107.

The step of applying the template 103 to the glass substrate 105 may comprise use of a template adhesive. In some embodiments, the template 103 may comprise the template adhesive on a bottom surface, the template adhesive being capable of removably adhering the template 103 to the glass substrate 105. In some embodiments, the template adhesive may be protected by a protective film (not shown) which may be peeled off of the bottom surface after the template 103 is exposed to UV light 104 and developed. In other embodiments, the template adhesive may be applied to the glass substrate 105 prior to application of the template 103.

The step of spraying abrasive blasting media 106a onto the template to remove the brittle portion and form a stencil in the shape of the pre-determined design 101 and then spraying the blasting media through the stencil to create a depression 107 in the glass substrate 105. Because the UV-exposed areas of the template are brittle, the blasting media quickly removes that portion of the template to form a stencil in the shape of the pre-determined design 101, and thereby exposing the glass substrate through the stencil. The blasting media can then be sprayed through the template 103 onto the glass substrate to create a depression 107 in the glass substrate 105. The sandblasting device 106 may be directed at the design 101 in the template 103 until a depression 107 of desired depth is created in the glass substrate 105. The blasting steps may comprise the use of a sandblasting device 106. In some embodiments, the sandblasting device 106 may comprise a commercially available sandblasting device.

The depression 107 may comprise a shape complementary to a shape of the embellishment 110, and a depth suitable to adhere the embellishment 110 in the glass substrate 105 in a recessed manner. In such embodiments, a profile of the embellishment in relation to the surface of the glass substrate may be reduced, in turn reducing the lateral force applied to the embellishment while being hand-washed or handled. Further, in such embodiments, the adhesive used to mount the embellishment may be protected from exposure to jets of hot water and solvents while being washed in a dishwasher.

In embodiments wherein the design 101 comprises both an embellishment shape 101a and an artistic shape 101b, sand 106a may be sprayed into the embellishment shape 101a for a longer period of time than sand 106a is sprayed into the artistic shape 101b, thus creating a deeper depression 107 under the embellishment shape 101a than under the artistic shape 101b. In such embodiments, the embellishment 110 may be mounted in the glass substrate 105 with a reduced profile, while a shallow etching 108 is created in the glass substrate 105 under the artistic shape 101b.

The step of applying an adhesive to the depression 107 may comprise applying a UV-curable adhesive using an eyedropper-style dispenser 109 (or other applicator). In other embodiments, the adhesive may be applied via at least one of a brush and a stick. The step of positioning an embellishment 110 in the depression 107 may comprise placing an embellishment 110 with a shape complementary to the shape of the depression 107 into the depression 107. In some embodiments, the embellishment 110 may be positioned by hand. In other embodiments, the embellishment 110 may be mechanically positioned. In some embodiments, the embellishment 110 may comprise at least one of a rhinestone, a bead, a jewel, a piece of metal, and the like. In some embodiments, the piece of metal may comprise the shape of a letter or a symbol.

In embodiments wherein the adhesive comprises a UV-curable adhesive, the method of adhering embellishments 110 to a glass substrate 105 may comprise the step of curing the UV sensitive glass glue via exposure to UV light 104 for a period of time (e.g., in a range of about 30 seconds to about 5 minutes). After the embellishment is placed in the depression, UV like may be shined on the adhesive through the glass substrate for a period of time (e.g., 2 to 5 minutes) to cure the adhesive. After the UV exposure period, the UV-curable adhesive may be fully cured and the embellishment set in the depression.

CONCLUSION/SUMMARY

The present invention provides methods for adhering an embellishment to a glass substrate. It is to be understood that variations, modifications, and permutations of embodiments of the present invention, and uses thereof, may be made without departing from the scope of the invention. It is also to be understood that the present invention is not limited by the specific embodiments, descriptions, or illustrations or combinations of either components or steps disclosed herein. The embodiments were chosen and described in order to best explain the principles of the invention and its practical application, to thereby enable others skilled in the art to best utilize the invention and various embodiments with various modifications as are suited to the particular use contemplated. Although reference has been made to the accompanying figures, it is to be appreciated that these figures are exemplary and are not meant to limit the scope of the invention. It is intended that the scope of the invention be defined by the claims appended hereto and their equivalents.

What is claimed is:

1. A method for adhering an embellishment to a glass substrate, comprising the steps of:
   a. creating a template having a design therein corresponding to a shape of an embellishment;
   b. applying said template to said glass substrate;
   c. transferring said design in said template to said glass substrate by creating a complementary etching of said design, wherein said etching is sufficiently deep to allow said embellishment to be set in said etching in a low-profile manner;
   d. applying a UV sensitive adhesive to said etching;
   e. positioning said embellishment in said etching; and
   f. curing said UV sensitive adhesive by applying UV light through at least one of said embellishment and said glass substrate, wherein said embellishment is positioned in said etching such that physical access to said cured adhesive is restricted.

2. The method of claim 1, wherein said template comprises a plurality of designs corresponding to one or more embellishment shapes.

3. The method of claim 1, wherein said design further comprises an artistic shape.

4. The method of claim 3, wherein creating said complementary etching of said design comprises spraying abrasive sand into said design via a sandblasting device.

5. The method of claim 4, wherein said abrasive sand is sprayed into said embellishment shape for a longer period of time than said abrasive sand is sprayed into said artistic shape.

6. The method of claim 1, wherein said substrate comprises at least one of a wine glass, a beer glass, a pint glass, a liquor glass, a coffee cup, a vase, a plate, a sheet of glass, a mirror, a window, and the like.

7. The method of claim 1, wherein said template comprises an abrasion resistant material.

8. The method of claim 1, wherein said template comprises a UV sensitive film.

9. The method of claim 8, wherein said design is applied to said UV sensitive film via exposure to UV light through a transparent medium and development in a developer solution.

10. The method of claim 1, wherein said glass substrate is acrylic glass.

11. The method of claim 1, wherein said embellishment comprises at least one of a rhinestone, a bead, a jewel, a piece of metal, and the like.

12. The method of claim 1, wherein said UV sensitive adhesive is substantially translucent and imperceptible to the human eye after being cured via UV radiation.

13. A method for adding embellishments to a glass substrate, comprising the steps of:
   a. creating a design comprising at least one embellishment shape, said at least one embellishment shape representing the shape of at least one embellishment to be applied to said glass substrate;
   b. applying said design to an abrasion resistant template such that said design defines at least one opening in said abrasion resistant template;
   c. adhering said abrasion resistant template to said glass substrate via a template adhesive;
   d. spraying a blasting medium through said at least one opening to create at least one depression in said glass substrate;
   e. removing said abrasion resistant template from said glass substrate;
   f. applying a UV-curable adhesive to said at least one depression in said glass substrate;
   g. positioning said at least one embellishment in said at least one depression in a low-profile manner such that physical access to said UV-curable adhesive is substantially restricted; and h. exposing said UV-curable adhesive to UV light for a period of time through at least one of said glass substrate and said at least one embellishment.

14. The method of claim 13, wherein said design is applied to said abrasion resistant template via a photomask.

15. The method of claim 13, wherein said design further comprises at least one artistic shape.

16. The method of claim 13, wherein said UV-curable adhesive comprises at least one of a polyurethane acrylate-based main-chain polymer, a poly-isoprene acrylate-based main-chain polymer, a polybutadiene acrylate-based main-chain polymer, and a monomeric (meth)acrylate.

17. The method of claim 13, wherein said UV-curable adhesive is substantially translucent and imperceptible to the human eye after being cured by UV radiation.

18. A method for attaching an embellishment to a substrate, the method comprising the steps of:
   a. providing a substrate which permits the passage of UV light therethrough;
   b. creating an abrasion resistant template comprising a design, said design having a shape complementary to a shape of an embellishment;
   c. etching said design into said substrate via sandblasting through said abrasion resistant template;
   d. applying a UV-curable adhesive to said etching;
   e. setting said embellishment into said etching in a low-profile manner wherein physical access to said UV-curable adhesive is restricted;
   f. curing said UV-curable adhesive by directing UV light at said UV-curable adhesive through said substrate.

19. The method of claim 18, wherein said abrasion resistant template is UV-sensitive, and said design is created by exposing said abrasion resistant template to UV light through a photomask.

20. The method of claim 19, wherein said photomask is printed from a digital image.

\* \* \* \* \*